United States Patent
Liu et al.

(10) Patent No.: US 12,287,159 B2
(45) Date of Patent: Apr. 29, 2025

(54) HEAT DISSIPATION MODULE AND CONNECTOR

(71) Applicant: Tyco Electronics (Shanghai) Co. Ltd., Shanghai (CN)

(72) Inventors: WenYu (Vindy) Liu, Shanghai (CN); Xingjie (Steven) Ge, Shanghai (CN); Xinbo (Polly) Liu, Shanghai (CN)

(73) Assignee: Tyco Electronics (Shanghai) Co., Ltd., Shanghai (CN)

( * ) Notice: Subject to any disclaimer, the term of this patent is extended or adjusted under 35 U.S.C. 154(b) by 344 days.

(21) Appl. No.: 17/879,294

(22) Filed: Aug. 2, 2022

(65) Prior Publication Data
US 2023/0030112 A1   Feb. 2, 2023

(30) Foreign Application Priority Data
Aug. 2, 2021 (CN) .......................... 202110880619.6

(51) Int. Cl.
| | |
|---|---|
| G02B 6/42 | (2006.01) |
| F28F 1/32 | (2006.01) |
| F28F 9/00 | (2006.01) |
| H05K 7/20 | (2006.01) |

(52) U.S. Cl.
CPC .............. *F28F 1/325* (2013.01); *F28F 9/001* (2013.01); *G02B 6/4269* (2013.01); *H05K 7/20418* (2013.01); *F28F 2215/14* (2013.01); *F28F 2255/02* (2013.01)

(58) Field of Classification Search
CPC .......................... G02B 6/4269; H05K 7/20418
See application file for complete search history.

(56) References Cited

U.S. PATENT DOCUMENTS

| | | | |
|---|---|---|---|
| 2009/0229791 A1* | 9/2009 | Hung ................. | F28D 15/0275 165/80.3 |
| 2010/0165573 A1* | 7/2010 | Fang ..................... | H01L 23/467 361/710 |
| 2019/0387644 A1* | 12/2019 | Liu ..................... | H05K 7/20436 |

* cited by examiner

*Primary Examiner* — Eric S Ruppert
(74) *Attorney, Agent, or Firm* — Barley Snyder

(57) ABSTRACT

A heat dissipation module includes a plurality of heat dissipation units arranged along a longitudinal direction of the heat dissipation module. Each heat dissipation unit has a plurality of heat dissipation fins arranged at intervals along a transverse direction of the heat dissipation module. The heat dissipation fins of a first heat dissipation unit of a pair of adjacent heat dissipation units are each coupled with one of the heat dissipation fins of a second heat dissipation unit of the pair of adjacent heat dissipation units by a coupling structure. The heat dissipation fins of the first heat dissipation unit and the heat dissipation fins of the second heat dissipation unit are displaceable with respect to each other within a certain range.

20 Claims, 4 Drawing Sheets

HEAT DISSIPATION MODULE AND CONNECTOR

CROSS-REFERENCE TO RELATED APPLICATIONS

This application claims the benefit of the filing date under 35 U.S.C. § 119(a)-(d) of Chinese Patent Application No. 202110880619.6, filed on Aug. 2, 2021.

FIELD OF THE INVENTION

Embodiments of the present disclosure relate to the field of heat dissipation, and more particularly, to a heat dissipation module and a connector including the same.

BACKGROUND

In the related art, a plurality of independent heat dissipation fins are usually designed in a transverse direction of a heat dissipation module, to accommodate the flatness and roughness of the heat dissipation module in the transverse direction. However, in a longitudinal direction of the heat dissipation module, each heat dissipation fin is whole, so it cannot accommodate the flatness and roughness in the longitudinal direction of the heat dissipation module. As a result, a contact air gap will form in the longitudinal direction of the heat dissipation module and good heat conduction cannot be achieved.

SUMMARY

A heat dissipation module includes a plurality of heat dissipation units arranged along a longitudinal direction of the heat dissipation module. Each heat dissipation unit has a plurality of heat dissipation fins arranged at intervals along a transverse direction of the heat dissipation module. The heat dissipation fins of a first heat dissipation unit of a pair of adjacent heat dissipation units are each coupled with one of the heat dissipation fins of a second heat dissipation unit of the pair of adjacent heat dissipation units by a coupling structure. The heat dissipation fins of the first heat dissipation unit and the heat dissipation fins of the second heat dissipation unit are displaceable with respect to each other within a certain range.

BRIEF DESCRIPTION OF THE DRAWINGS

The invention will now be described by way of example with reference to the accompanying Figures, of which.

DETAILED DESCRIPTION OF THE EMBODIMENTS

Figure 1:
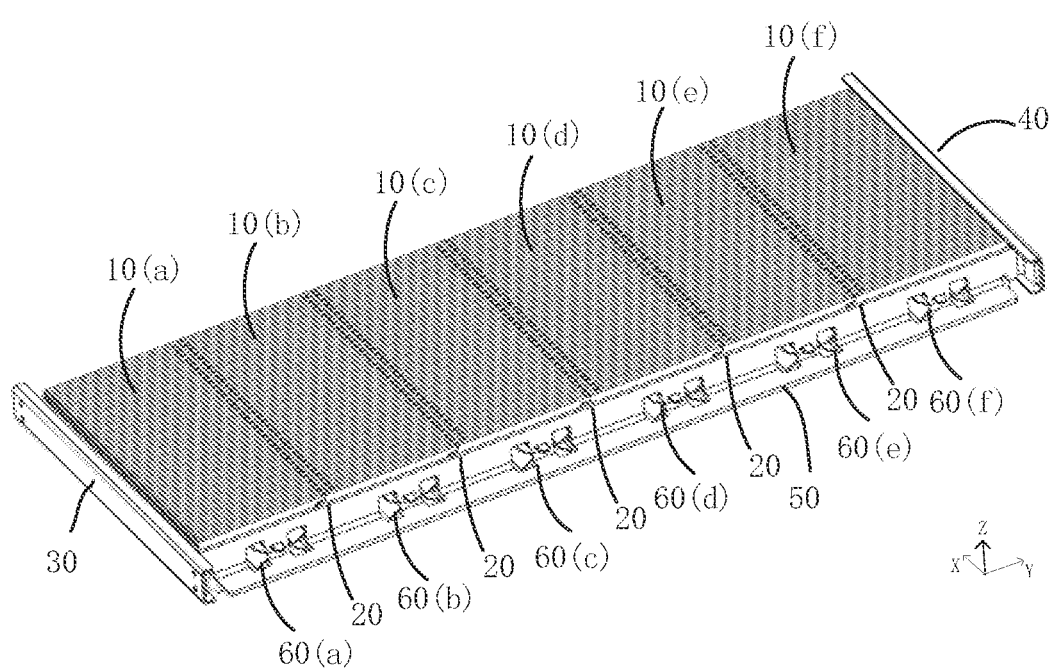
FIG. 1 is a perspective view of a heat dissipation module according to an embodiment.

The technical solutions of the present disclosure will be specifically described below through the embodiments and in conjunction with the accompanying drawings. In the description, the same or similar parts are indicated by the same or similar reference numerals. The description of embodiments of the present disclosure hereinafter with reference to the accompanying drawings is intended to explain the general inventive concept of the present disclosure and should not be construed as a limitation on the present disclosure.

In addition, in the following detailed description, for the sake of explanation, numerous specific details are set forth in order to provide a thorough understanding of the disclosed embodiments. It will be apparent, however, that one or more embodiments may also be practiced without these specific details. In other instances, well-known structures and devices are illustrated schematically in order to simplify the drawing.

Figure 2:
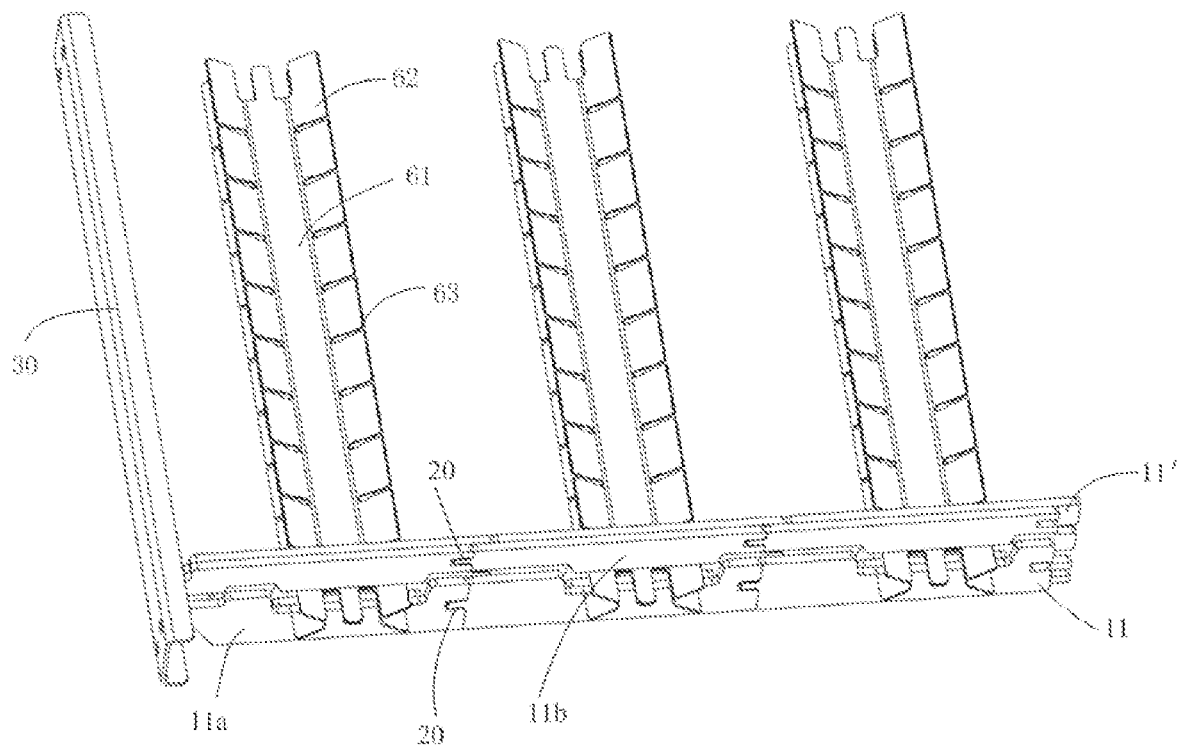
FIG. 2 is perspective view of a left frame, heat dissipation fins, and a portion of an elastic beam of the heat dissipation module.
Figure 3:
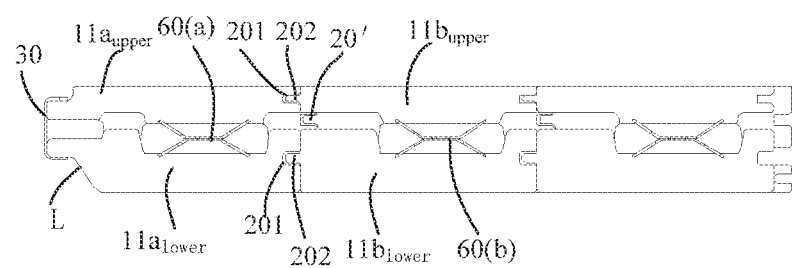
FIG. 3 is a plan view of the left frame, the heat dissipation fins, and the portion of the elastic beam of the heat dissipation module.

As shown in FIG. 1 to FIG. 3, a heat dissipation module according to an exemplary embodiment of the present disclosure includes a plurality of heat dissipation units 10(a)-10(f) arranged along a longitudinal direction Y of the heat dissipation module. Each heat dissipation unit 10(a)-10(f) includes a plurality of heat dissipation fins 11, 11' arranged at intervals along a transverse direction X of the heat dissipation module.

The plurality of heat dissipation fins 11a of one heat dissipation unit 10a of two adjacent heat dissipation units (for example, 10a, 10b) are coupled with the plurality of heat dissipation fins 11b of the other heat dissipation unit 10b of the two adjacent heat dissipation units in a one-to-one correspondence via a coupling structure 20, so that the two adjacent heat dissipation fins 11a, 11b can be displaced from each other within a certain range. In this manner, the adjacent heat dissipation units can be displaced from each other within a certain range to achieve a floating structure by dividing the heat dissipation module into a plurality of heat dissipation units 10(a)-10(f), so that its integral design in the longitudinal direction Y is replaced with a multi-stage design, achieving conformal contact, overcoming the flatness in the longitudinal direction, and achieving good heat conduction.

The coupling structure 20, as shown in FIG. 3, includes a groove 201 provided at an end of the heat dissipation fin 11a, facing the other heat dissipation unit 10b, of one heat dissipation unit 10a, and the heat dissipation fin 11b of the other heat dissipation unit 10b is provided with a lug 202 for being engaged with the groove 201. Connection of the two adjacent heat dissipation units is realized through an engagement of the groove 201 and the lug 202. In the present disclosure, by dividing the heat dissipation module into plurality of heat dissipation units 10(a)-10(f) arranged along the longitudinal direction Y of the heat dissipation module, the adjacent heat dissipation units are coupled by the coupling structure 20, so as to accommodate the flatness and roughness of the heat dissipation module in the longitudinal direction Y and to achieve good heat conduction.

In the exemplary embodiment of the present disclosure shown in FIGS. 2 and 3, a size of the groove 201 in a height direction Z of the heat dissipation module is 0.1 mm-0.2 mm greater than a size of the lug 202 in the height direction Z of the heat dissipation module, so that the heat dissipation fins 11, 11' may float, which can better accommodate the flatness and roughness of the heat dissipation module in the longitudinal direction Y.

In the exemplary embodiment of the present disclosure shown in FIGS. 1 to 3, the heat dissipation module further includes: a left frame 30 and a right frame 40. The left frame 30 is configured for connection (e.g., by welding) to the heat dissipation fin 11a located at a first end of the heat dissipation module in the longitudinal direction Y. The right frame 40 is configured for connection (e.g., by welding) to the heat dissipation fin located at a second end, opposite to the first end, of the heat dissipation module in the longitudinal direction Y. During the assembly process, it is necessary to ensure that the end faces of the adjacent heat dissipation fins along the longitudinal direction Y of the heat dissipation module are in close contact, and the left frame 30 and the right frame 40 are also in close contact with the heat dissipation fins.

In the exemplary embodiment of the present disclosure shown in FIGS. 2 and 3, the heat dissipation fin 11a connected to the left frame 30 has a guiding portion L, to facilitate the assembling of the heat dissipation fins 11. However, it should be noted that, in some other embodiments of the present disclosure, the heat dissipation fin 11b connected to the right frame 40 can also have a guiding portion, or in another embodiment, only the heat dissipation fin 11b connected to the right frame 40 has a guiding portion.

As shown in FIGS. 1 and 2, each heat dissipation unit 10 further includes an elastic beam 60 extended in the transverse direction X of the heat dissipation module. The elastic beam 60 is configured to generate a compressive force, so that the heat dissipation fin of the corresponding heat dissipation unit 10 is closely attached to a substrate (for example, the substrate on which the heat dissipation fins are mounted), thereby fixing the corresponding heat dissipation unit 10. The elastic beam 60 can be shaped to resist bending or flexing. However, when flexed, the elastic beam 60 may provide an elastic force for pushing the heat dissipation module towards a device to which the heat dissipation module is affixed (e.g., a metal housing of a connector).

In the exemplary embodiment of the present disclosure shown in FIG. 2, the elastic beam 60 includes a beam body 61 and four plate-like members 62 extending radially outward from a circumferential surface of the beam body 61. The heat dissipation fin 11a, 11b is in contact with the four plate-like members 62.

As shown in FIG. 2, a plurality of recesses 63 are formed at one side of each plate-like member 62 away from the beam body 61. The plurality of recesses 63 are arranged at intervals along an extension direction of the beam body 61, and the heat dissipation fins 11, 11' are in contact with a portion of the plate-like member 62 between two corresponding recesses 63.

In the exemplary embodiment of the present disclosure shown in FIG. 1, the heat dissipation module further includes: a front frame 50 and a rear frame. The front frame 50 is located at a first side of the heat dissipation module in the transverse direction X and configured for connection to a first end of the elastic beam 60, for example, the front frame 50 is formed with a through hole in which the elastic beam 60 is inserted. The rear frame is located at a second side of the heat dissipation module opposite to the first side in the transverse direction X and configured for connection to a second end of the elastic beam 60 opposite to the first end, for example, the rear frame is formed with a through hole in which the elastic beam 60 is inserted.

In the exemplary embodiment of the present disclosure shown in FIGS. 2 and 3, the heat dissipation fins $11a$ ($11b$) include an upper heat dissipation fin $11a_{upper}$ ($11b_{upper}$) and a lower heat dissipation fin $11a_{lower}$ ($11b_{lower}$) located below the upper heat dissipation fin $11a_{upper}$ ($11b_{upper}$). The plurality of upper heat dissipation fins $11a_{upper}$ of one heat dissipation unit 10a of the two adjacent heat dissipation units 10a, 10b are coupled with the plurality of upper heat dissipation fins $11b_{upper}$ of the other heat dissipation unit 10b of the two adjacent heat dissipation units in a one-to-one correspondence via the coupling structure 20. The plurality of lower heat dissipation fins $11a_{lower}$ of one heat dissipation unit 10a of the two adjacent heat dissipation units 10a, 10b are coupled with the plurality of lower heat dissipation fins $11b_{lower}$ of the other heat dissipation unit 10b of the two adjacent heat dissipation units in a one-to-one correspondence via the coupling structure 20.

In the exemplary embodiment of the present disclosure shown in FIGS. 2 and 3, the coupling structure 20 for the upper heat dissipation fins $11a_{upper}$, $11b_{upper}$ of the two adjacent heat dissipation units 10a, 10b and the coupling structure 20 for the lower heat dissipation fins $11a_{lower}$, $11b_{lower}$ of the two adjacent heat dissipation units 10a, 10b are aligned in the height direction Z of the heat dissipation module.

In the exemplary embodiment of the present disclosure shown in FIGS. 1 to 3, the coupling structures 20, 20' for at least two heat dissipation fins 11, 11' of the plurality of heat dissipation fins arranged at intervals along the transverse direction X of the heat transfer module and in the two adjacent heat dissipation units 10a, 10b are designed to be staggered in the transverse direction X of the heat dissipation module. In this manner, it can achieve better overall structural strength while also improving heat exchange, thereby resulting in better thermal conductivity.

In the exemplary embodiment of the present disclosure shown in FIGS. 1 to 3, the coupling structures 20 for the odd number of heat dissipation fins 11 of the plurality of heat dissipation fins arranged at intervals along the transverse direction X of the heat dissipation module and in the two adjacent heat dissipation units 10a, 10b are aligned in the transverse direction X of the heat dissipation module. The coupling structures 20' for the even number of heat dissipation fins 11' of the plurality of heat dissipation fins arranged at intervals along the transverse direction X of the heat dissipation module and in the two adjacent heat dissipation units 10a, 10b are aligned in the transverse direction X of the heat dissipation module. The coupling structures 20 for the odd number of heat dissipation fins 11 and the coupling structures 20' for the even number of heat dissipation fins 11' are designed to be staggered.

Figure 4:
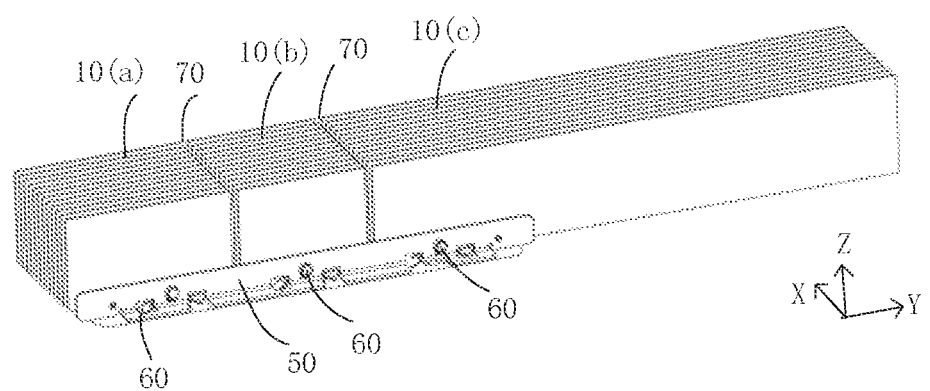
FIG. 4 is a perspective view of a heat dissipation module according to another embodiment.
Figure 5:
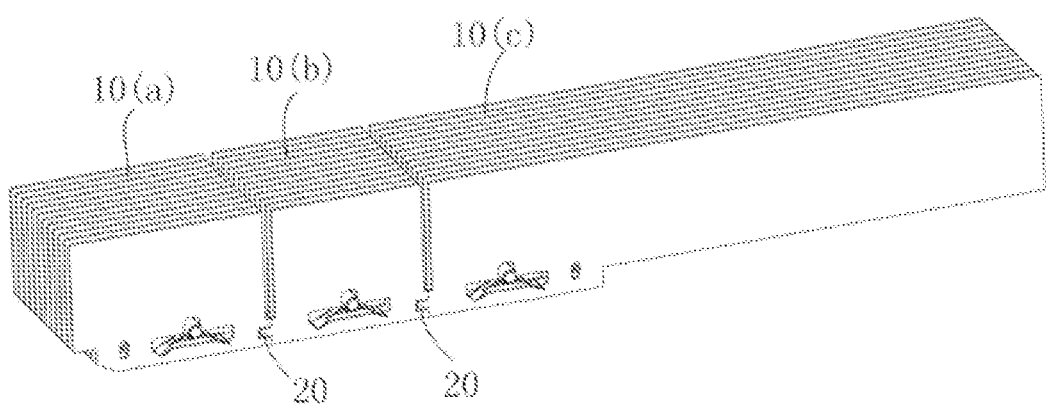
FIG. 5 is a perspective view of the heat dissipation module of FIG. 4 with a front frame removed.
Figure 6:
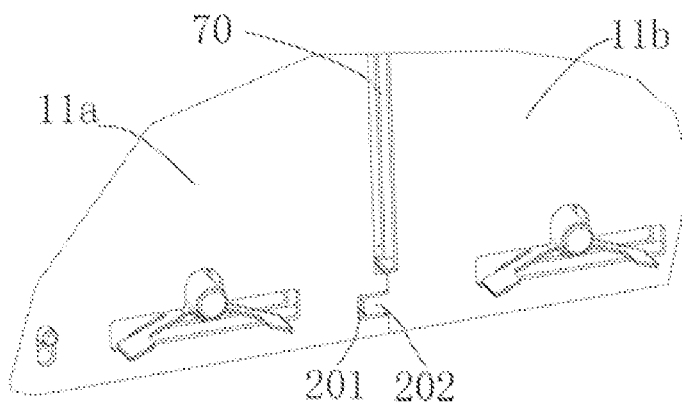
FIG. 6 is an enlarged view of a portion of FIG. 4.

In another embodiment, as shown in FIGS. 4 to 6, the heat dissipation module includes a plurality of heat dissipation units 10(a)-10(c) arranged along a longitudinal direction Y of the heat dissipation module. Each heat dissipation unit 10(a)-10(c) includes a plurality of heat dissipation fins 11 arranged at intervals along a transverse direction X of the heat dissipation module. A gap 70 is provided between upper portions of two adjacent heat dissipation units along the height direction Z of the heat dissipation module, and the coupling structure 20 is located directly below the gap 70.

The plurality of heat dissipation fins 11 of one heat dissipation unit 10a of two adjacent heat dissipation units 10 (for example, 10a, 10b) are coupled with the plurality of heat dissipation fins 11b of the other heat dissipation unit 10b of the two adjacent heat dissipation units in a one-to-one correspondence via the coupling structure 20. This coupling structure is similar to that in the first embodiment. Specifically, the coupling structure 20 includes a groove 201 provided at an end of the heat dissipation fin 11a, facing the other heat dissipation unit 10b, of one heat dissipation unit 10a, and the heat dissipation fin 11b of the other heat dissipation unit 10b is provided with a lug 202 for being engaged with the groove 201, as shown in FIG. 6. Connection of the two adjacent heat dissipation units is realized through an engagement of the groove 201 and the lug 202. In the present disclosure, by dividing the heat dissipation module into plurality of heat dissipation units 10(a)-10(f) arranged along the longitudinal direction Y of the heat dissipation module, the adjacent heat dissipation units are coupled by the coupling structure 20, so as to accommodate the flatness and roughness of the heat dissipation module in the longitudinal direction and to achieve good heat conduction.

In this embodiment, as shown in FIGS. 4 to 6, a size of the groove 201 in a height direction Z of the heat dissipation module is 0.1 mm-0.2 mm greater than size of the lug 202 in the height direction Z of the heat dissipation module, so that the heat dissipation fins may float, which can better accommodate the flatness and roughness of the heat dissipation module in the longitudinal direction Y and achieve better heat conduction.

Figure 7:
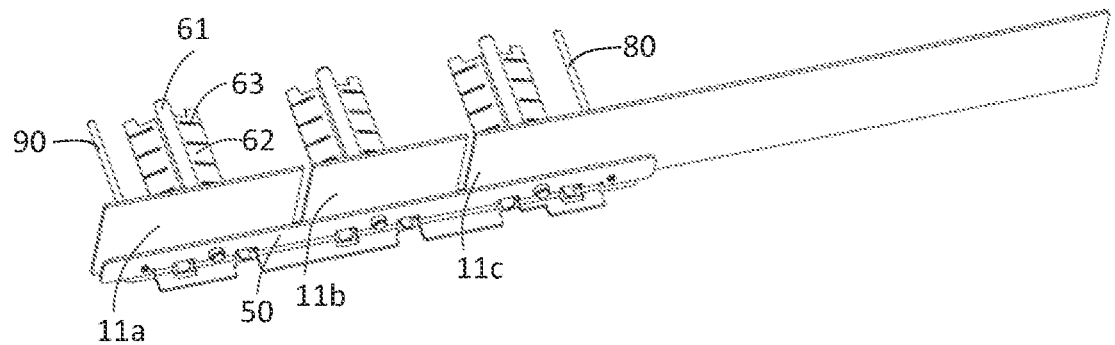
FIG. 7 is a perspective view of a front frame, heat dissipation fins, and a portion of an elastic beam of the heat dissipation module of FIG. 4.
Figure 8:
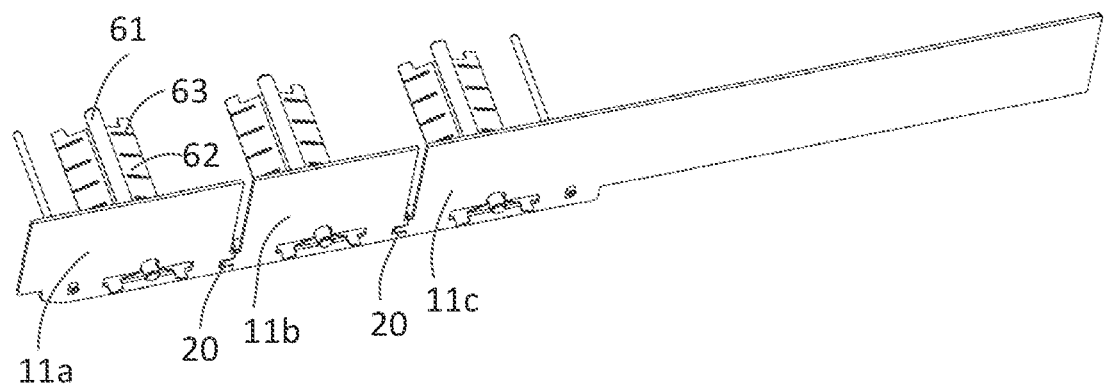
FIG. 8 is another perspective view of the front frame, the heat dissipation fins, and the portion of the elastic beam of the heat dissipation module of FIG. 4.

In the exemplary embodiment of the present disclosure shown in FIGS. 7 and 8, the elastic beam 60 includes a beam body 61 and two plate-like members 62 extending obliquely downward from a circumferential surface of the beam body 61, and the heat dissipation fins 11 are in contact with the plate-like members 62. It should be noted that those skilled in the art should understand that, in some other embodiments of the present disclosure, the elastic beam may also be any known in the art or any applicable elastic beam.

In the exemplary embodiment of the present disclosure shown in FIGS. 4 and 5, the coupling structures 20 between the two adjacent heat dissipation units 10a, 10b are aligned in the transverse direction X of the heat dissipation module.

In the exemplary embodiment of the present disclosure shown in FIG. 4, the heat dissipation module further includes: a front frame 50 and a rear frame. The front frame 50 is located at a first side of the heat dissipation module in the transverse direction X and configured for connection to a first end of the elastic beam 60, for example, the front frame 50 is formed with a through hole in which the elastic beam 60 is inserted. The rear frame is located at a second side of the heat dissipation module opposite to the first side in the transverse direction X and configured for connection to a second end of the elastic beam 60 opposite to the first end, for example, the rear frame is formed with a through hole in which the elastic beam 60 is inserted.

In the exemplary embodiment shown in FIG. 7, the heat dissipation module further includes a left guide member 90 and a right guide member 80. The left guide member 90 is configured to fix and guide the plurality of heat dissipation fins 11a of the heat dissipation module 10a located at a first end of the heat dissipation module in the longitudinal direction Y. In this embodiment, each heat dissipation fin 11a of the heat dissipation module 10a is formed with a hole through which the left guide member 90 passes, and the front frame 50 and the rear frame are also respectively formed with a hole through which the left guide member 90 passes so that the left guide member 90 is inserted therein, and the heat dissipation fins 11a are thus fixed. The right frame 40 is configured for connection to the heat dissipation fin located at a second end, opposite to the first end, of the heat dissipation module in the longitudinal direction Y. In this embodiment, each heat dissipation fin 11c of the heat dissipation module 10c is formed with a hole through which the right guide member 80 passes, and the front frame 50 and the rear frame are also respectively formed with a hole through which the right guide member 80 passes so that the right guide member 80 is inserted therein, and the heat dissipation fins 11c are thus fixed.

According to another aspect of the present disclosure, the heat dissipation module can be applied to a connector that is plugged into a high-speed data communication module. The connector includes a metal housing. The heat dissipation module according to the embodiments of the present disclosure can be mounted on the top of the metal housing to dissipate heat from the high-speed data communication module.

According to the heat dissipation module of the forgoing various exemplary embodiments of the present disclosure, the adjacent heat dissipation units can be displaced from each other within a certain range to achieve floating structure by dividing the heat dissipation module into a plurality of heat dissipation units so that its integral design in the longitudinal direction is replaced with a multi-stage design, so as to achieve conformal contact and overcome the flatness in the longitudinal direction, and can achieve good heat conduction.

Those skilled in the art can understand that the above-described embodiments are all exemplary, and those skilled in the art can make improvements thereto, and the structures described in the various embodiments can be freely combined without conflicting in terms of structure or principle.

Although the present disclosure is described with reference to the accompanying drawings, the embodiments disclosed in the accompanying drawings are intended to illustrate embodiments of the present disclosure, and should not be construed as a limitation of the present disclosure.

Although some embodiments of the present disclosure have been shown and described, it would be appreciated by those skilled in the art that changes or modification may be made to these embodiments without departing from the principles and spirit of the present disclosure, the scope of which is defined in claims and their equivalents.

It should be noted that, unless otherwise specified, the word "comprise" or "include" or "have" used herein doesn't exclude other elements or steps, and the word "a" or "an" or "one" used herein doesn't exclude multiple. In addition, any reference numerals in the claims should not be interpreted as the limitation to the scope of the present disclosure.

What is claimed is:

1. A heat dissipation module, comprising:
a plurality of heat dissipation units arranged along a longitudinal direction of the heat dissipation module, each heat dissipation unit has a plurality of heat dissipation fins arranged at intervals along a transverse direction of the heat dissipation module, and an elastic beam extending in the transverse direction and fixing the heat dissipation unit, the heat dissipation fins of a first heat dissipation unit of a pair of adjacent heat dissipation units are each coupled with one of the heat dissipation fins of a second heat dissipation unit of the pair of adjacent heat dissipation units by a coupling structure, the heat dissipation fins of the first heat dissipation unit and the heat dissipation fins of the second heat dissipation unit are displaceable with respect to each other within a certain range.

2. The heat dissipation module of claim 1, wherein the coupling structure has a groove at an end of the heat dissipation fins of the first heat dissipation unit facing the second heat dissipation unit, and the coupling structure has a lug at an end of the heat dissipation fins of the second heat dissipation unit, the lug engages the groove.

3. The heat dissipation module of claim 2, wherein the groove has a size in a height direction of the heat dissipation module that is greater than a size of the lug in the height direction.

4. The heat dissipation module of claim 1, further comprising a left frame connected to the heat dissipation fins of the one of the heat dissipation units disposed at a first end of the heat dissipation module in the longitudinal direction, and a right frame connected to the heat dissipation fins of the one of the heat dissipation units disposed at a second end of the heat dissipation module opposite to the first end in the longitudinal direction.

5. The heat dissipation module of claim 4, wherein the heat dissipation fins connected to the left frame have a guiding portion and/or the heat dissipation fins connected to the right frame have a guiding portion.

6. The heat dissipation module of claim 1, wherein the heat dissipation fins each include an upper heat dissipation fin and a lower heat dissipation fin located below the upper heat dissipation fin.

7. The heat dissipation module of claim 6, wherein the upper heat dissipation fins of the first heat dissipation unit are coupled with the upper heat dissipation fins of the second heat dissipation unit by the coupling structure, and the lower heat dissipation fins of the first heat dissipation unit are coupled with the lower heat dissipation fins of the second heat dissipation unit by the coupling structure.

8. The heat dissipation module of claim 7, wherein the coupling structure for the upper heat dissipation fins and the coupling structure for the lower heat dissipation fins are aligned in a height direction of the heat dissipation module.

9. The heat dissipation module of claim 1, wherein a gap is disposed between a pair of upper portions of the pair of adjacent heat dissipation units along a height direction of the heat dissipation module.

10. The heat dissipation module of claim 9, wherein the coupling structure is disposed directly below the gap.

11. A heat dissipation module, comprising:
a plurality of heat dissipation units arranged along a longitudinal direction of the heat dissipation module, each heat dissipation unit has a plurality of heat dissipation fins arranged at intervals along a transverse direction of the heat dissipation module, the heat dissipation fins of a first heat dissipation unit of a pair of adjacent heat dissipation units are each coupled with one of the heat dissipation fins of a second heat dissipation unit of the pair of adjacent heat dissipation units by a coupling structure, the heat dissipation fins of the first heat dissipation unit and the heat dissipation fins of the second heat dissipation unit are displaceable with respect to each other within a certain range, the coupling structures for different heat dissipation fins along the transverse direction are staggered in the transverse direction.

12. The heat dissipation module of claim 11, wherein the coupling structures for odd numbers of heat dissipation fins in the transverse direction are aligned in the transverse direction and the coupling structures for even numbers of heat dissipation fins in the transverse direction are aligned in the transverse direction.

13. The heat dissipation module of claim 11, wherein each heat dissipation unit has an elastic beam extending in the transverse direction and fixing the heat dissipation unit.

14. The heat dissipation module of claim 13, wherein the elastic beam has a beam body and a plurality of plate-like members extending radially outward from a circumferential surface of the beam body.

15. The heat dissipation module of claim 14, wherein the heat dissipation fins contact the plate-like members.

16. The heat dissipation module of claim 15, wherein a plurality of recesses are formed at a side of each plate-like member facing away from the beam body.

17. The heat dissipation module of claim 16, wherein the recesses are arranged at intervals along an extension direction of the beam body and the heat dissipation fins contact a portion of the plate-like members between the recesses.

18. The heat dissipation module of claim 13, further comprising a front frame at a first side of the heat dissipation module in the transverse direction and connected to a first end of the elastic beam.

19. The heat dissipation module of claim 18, further comprising a rear frame at a second side of the heat dissipation module opposite to the first side in the transverse direction and connected to a second end of the elastic beam opposite the first end.

20. A connector, comprising:
a metal housing; and
a heat dissipation module mounted on a top of the metal housing, comprising:
a plurality of heat dissipation units arranged along a longitudinal direction of the heat dissipation module, each heat dissipation unit has a plurality of heat dissipation fins arranged at intervals along a transverse direction of the heat dissipation module, the heat dissipation fins of a first heat dissipation unit of a pair of adjacent heat dissipation units are each coupled with one of the heat dissipation fins of a second heat dissipation unit of the pair of adjacent heat dissipation units by a coupling structure, the heat dissipation fins of the first heat dissipation unit and the heat dissipation fins of the second heat dissipation unit are displaceable with respect to each other within a certain range; and
a left frame connected to the heat dissipation fins of the one of the heat dissipation units disposed at a first end of the heat dissipation module in the longitudinal direction, and a right frame connected to the heat dissipation fins of the one of the heat dissipation units disposed at a second end of the heat dissipation module opposite to the first end in the longitudinal direction.

* * * * *